(12) United States Patent (10) Patent No.: US 7,863,752 B2
Ostrom (45) Date of Patent: Jan. 4, 2011

(54) MEMS DEVICE WITH INTEGRATED VIA AND SPACER

(75) Inventor: Robert Ostrom, Fremont, CA (US)

(73) Assignee: Capella Photonics, Inc., San Jose, CA (US)

( * ) Notice: Subject to any disclaimer, the term of this patent is extended or adjusted under 35 U.S.C. 154(b) by 22 days.

(21) Appl. No.: 12/392,947

(22) Filed: Feb. 25, 2009

(65) Prior Publication Data

US 2010/0214643 A1 Aug. 26, 2010

(51) Int. Cl.
*H01L 29/40* (2006.01)
*H01L 21/44* (2006.01)

(52) U.S. Cl. ........................ 257/774; 438/667

(58) Field of Classification Search ............... 216/39; 257/738, 744, 773, 774, E21.476, E21.502, 257/E21.597, E23.011; 438/114, 613, 667
See application file for complete search history.

(56) References Cited

U.S. PATENT DOCUMENTS

| 6,984,917 | B2 | 1/2006 | Greywall et al. ............ 310/310 |
| 7,015,060 | B1 | 3/2006 | Kubena et al. ................. 438/50 |
| 2002/0046985 | A1 | 4/2002 | Daneman et al. |
| 2002/0146200 | A1 | 10/2002 | Kudrle et al. |
| 2008/0122031 | A1 | 5/2008 | DeNatale et al. ............. 257/532 |
| 2008/0157339 | A1 | 7/2008 | Suilleabhain et al. ........ 257/690 |
| 2008/0157361 | A1 | 7/2008 | Wood et al. .................. 257/738 |

OTHER PUBLICATIONS

PCT International Search Report dated Apr. 16, 2010 issued for International Patent Application No. PCT/US2010/024621.

*Primary Examiner*—David N Spector
(74) *Attorney, Agent, or Firm*—Joshua D. Isenberg; JDI Patent (57) ABSTRACT

A MEMS device and fabrication method are disclosed. A bottom substrate having an insulating layer sandwiched between an upper layer and a lower layer may be bonded to a device layer. One or more portions of the upper layer may be selectively removed to form one or more device cavities. Conductive vias may be formed through the lower layer at locations that underlie the one or more device cavities and electrically isolated from the lower layer. Devices may be formed from the device layer. Each device overlies a corresponding device cavity. Each device may be connected to the rest of the device layer by one or more corresponding hinges formed from the device layer. One or more electrical contacts may be formed on a back side of the lower layer. Each contact is electrically connected to a corresponding conductive via.

19 Claims, 6 Drawing Sheets

MEMS DEVICE WITH INTEGRATED VIA AND SPACER

FIELD OF THE INVENTION

Embodiments of the present invention relate to MEMS manufacturing process of MEMS device for achieving high interconnect density while providing a precision control of the spacer with flexible subsequent manufacturing processes. More particularly embodiments of the present invention relates to a method of making MEMS device arrays.

BACKGROUND OF THE INVENTION

Currently, the MEMS dual-axis mirrors involve a precision spacer and electrode layer. This has been done by multiple wafer bonding process, resulting in poor manufacturing yield. The invention replaces the spacer-electrode stack with one spacer-VIA substrate. This process allows a variety of bonding methods for the subsequent processes, thus reducing the complexity of the fabrication process and improving the overall yield. The MEMS technology finds its applications in optics in which a small-size mirror (micromirror) in the order of 10 μm to 500 μm can be actuated by applied voltages. There are numerous prior arts on the mirror structures (found citations). In general, two-axis mirrors are more useful because the mirrors can steer the optical beam in two dimensions. Usually, these designs involve double hinges with gimble. There are two classes of actuator designs. The first class is to have the actuators on the same surface of the MEMS mirror layer but outside the optical region. Examples of these types of actuators include comb drive or thermal actuators. The second class is to have the actuator underneath the MEMS mirrors. These types of actuators are, in general, electrostatic. The structures of the second class is more commonly adopted in the applications requiring high-fill-factor and/or high-density mirrors. One example of these is described in U.S. Pat. No. 6,984,917 and is illustrated in FIG. 1.

Figure 1:
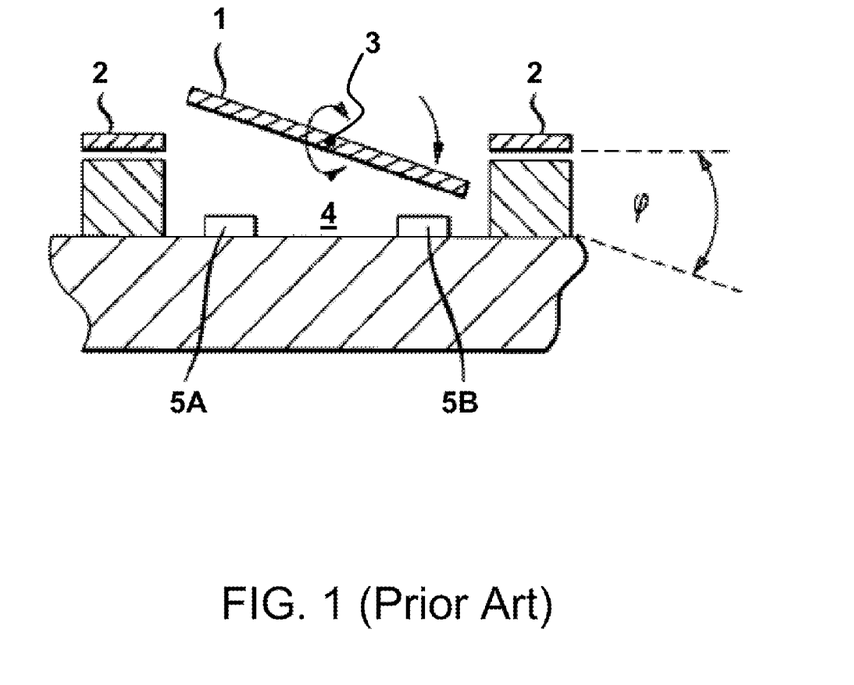
FIG. 1 is a cross section view a MEMS mirror of the prior art (prior art, U.S. Pat. No. 6,984,917)

As shown in FIG. 1, a mirror 1 and frame 2 are formed from a common sheet of material. The mirror 1 is connected to the frame 2 by a thin member 3 formed from the sheet of material. The thin member 3 lies along an axis of rotation that lies perpendicular to the plane of the drawing in FIG. 1. The thin member 3 acts as a torsional spring hinge. The mirror 1 is suspended over cavity 4 so that it is free to rotate. Electrodes 5A and 5B are disposed in the cavity 4. Electrodes 5A and 5B underlie a portion of the mirror 1, with one electrode on each side of an axis-of-rotation defined by the thin member 3.

When an electrical potential is applied between a mirror 1 and one of the underlying electrodes 5A, 5B, the cradle rotates out-of-plane, i.e., out of the plane defined by the support frame 2, about its axis of rotation toward the electrified electrode. Torsional forces developed by the thin member 3 tend to counteract the electrostatic force between the attractive electrode and cradle. The mirror 1 can rotate about the axis defined by the thin member 3 by an angle φ that depends on the voltages applied to the electrified electrode the separation of the mirror and the electrode and the torsional stiffness of the hinge. The direction of rotation depends on which electrode is electrified. For example, if an electric potential is applied between mirror 1 and electrode 5B, mirror 1 rotates out-of-plane of frame 2 about axis X such that the portion of mirror 1 that overlies electrode 5B moves downward toward that electrode.

In a device of the type shown in FIG. 1, the electrodes 5A and 5B should be electrically isolated from each other to avoid large currents between them when a voltage is applied.

In fact, in order to allow the mirror to tilt in both clockwise and counterclockwise in FIG. 1, two electrodes are needed. For dual-axis operation, 3 or 4 electrodes are needed. To ease the control algorithm, 4 electrodes per mirror are often employed.

Since the device is operated by electrostatic force, a physical gap between the electrodes and the mirror is very critical. This gap needs to be controlled with high precision to ensure the performance of the device. Typically, with a smaller gap, less voltage is needed to tilt the mirror to a certain angle. However, the maximum angle (before a snapping behavior occurs) is smaller. With a larger gap, higher voltage is needed to tilt the mirror to a certain angle, but the maximum angle is also enlarged. Therefore, there exists an optimal gap for each application.

While a through-wafer interconnect is commercially available, an integrated solution is not available without this integrated spacer. In order to access the electrodes underneath the MEMS mirror, a dedicated electrode layer is used to bring the electrical contact to a region with no MEMS mirror, followed by an access etch from the top structure. This consumes a significant portion of the area of the wafer on which MEMS mirrors are formed, reducing the number of dies per wafer. Using commercially available vias or through-wafer interconnects can change the interconnect direction from lateral to vertical. However, it does not integrate a spacer layer with sufficient thickness accuracy for the device operation. It turns out that combining an integrated spacer with a vertical interconnect substrate provides a large degree of process latitude. Competitors will have to build a spacer layer on top of the VIA wafer. The choice of the processes and materials will limit the choices of the subsequent process.

For example, if an organic material is selected, the subsequent process temperature will be limited.

In many applications, high density of micromirrors is required, either in 1×N or N×M format. The number of the mirrors increases the number of the controlling electrodes. For dual-axis operation, three or four electrodes may be needed for each micromirror. Therefore, for example, for a 10×10 micromirror array, the number of electrodes can be as large as 300 to 400.

Figure 2:
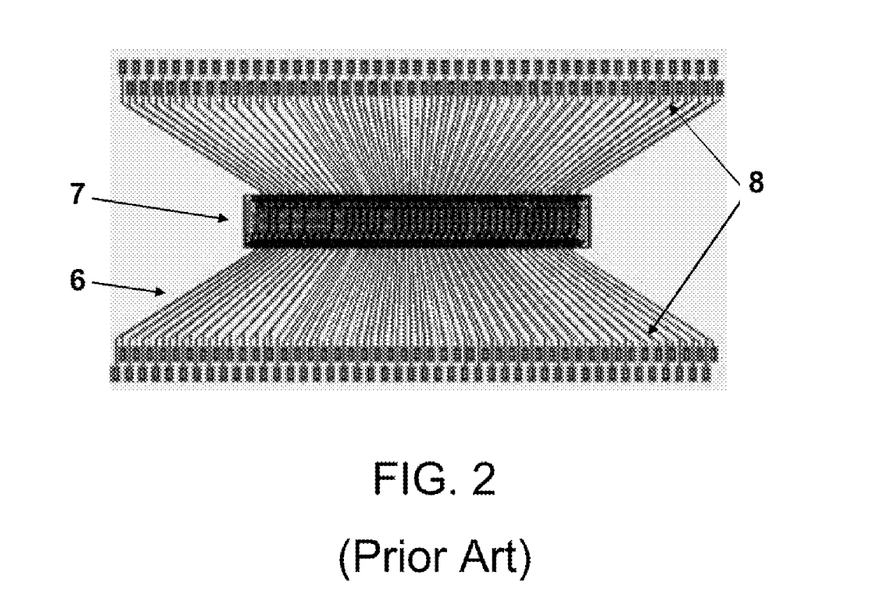
FIG. 2 is an example of the top view of a MEMS 1×N micromirror array according to the prior art.

As seen in FIG. 1, the electrodes are under the micromirrors. Therefore, there must be an electrical connection (interconnect) between the bond pads to the electrodes. In most cases, the size of the bond pads is larger than the size of the micromirrors. This causes the useable area of the overall die to be a small fraction of the entire die area, thus greatly reducing the number of dies per wafer. As an example to illustrate this issue, FIG. 2 shows a top view of a MEMS 1×N micromirror array. Since the pitch of the micromirrors is typically narrower than the pitch of the bond pads for standard wire bonding process, a fan-out-shaped interconnect region 6 is used to electrically connect an optical region 7 and a bond pad region 8. As may be seen from FIG. 2, the real estate of a MEMS wafer is not fully utilized by this approach. One approach to resolve the foregoing real estate issue is to perform the interconnect in the vertical direction by putting the electrode contacts of the bond pad region 8 on the backside of the MEMS wafer with electrical connection to the driver electronics by a solder bump process. The solder bump process, developed for flip-chip assembly for Silicon (Si) CMOS, offers a much higher interconnect density. In order to bring the electrical contact vertically, it is possible to integrate a commercially available through-wafer interconnect technology. Examples of such interconnect technology are described, e.g., in U.S. Patent Application Publications Numbers 20080122031, 20080157339, and 20080157361, which are incorporated herein by reference.

Figure 3:
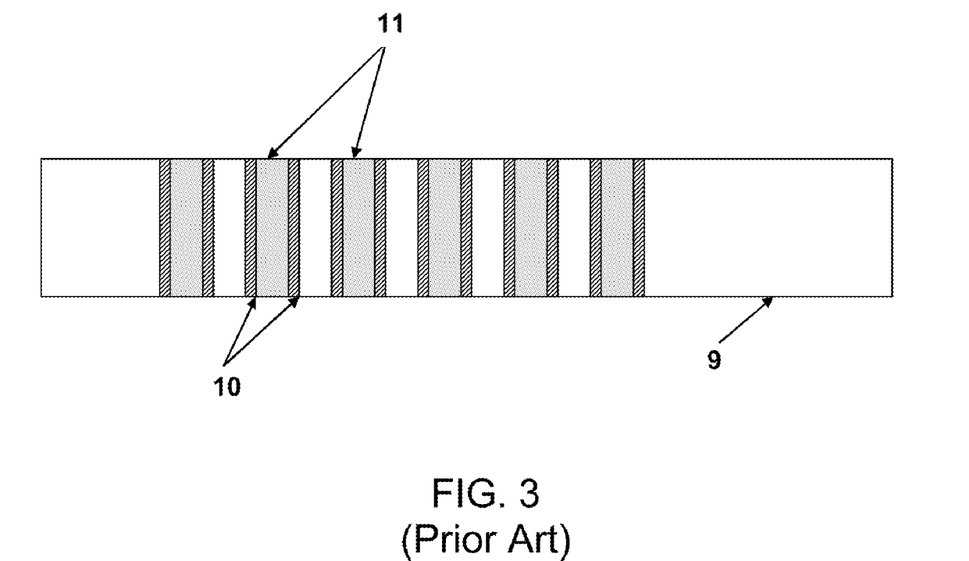
FIG. 3 is a cross section of a typical through-wafer interconnect of the prior art.

A typical through-wafer interconnect is shown in FIG. 3. The through-wafer interconnect technology may also be made by a standard MEMS fabrication process. First, through holes may be formed through a substrate 9, such as a Silicon (Si) wafer, followed by depositing insulating passivation layer 10 on the sidewalls of the holes. Then, a conducting material 11 is used to fill the remaining holes. The holes may be formed by an anisotropic etch process such as Deep Reactive Ion Etching (DRIE). The insulating passivation layer is typically thermally grown $SiO_2$. But, other deposition techniques (PECVD, CVD) may also be used.

The choices of the conducting materials are based on the applications. For applications in which conductivity is important, electroplated metals are commonly used. If low conductivity is acceptable, poly silicon is commonly used for the benefit of similar thermal expansion coefficient with the substrate.

Figure 4:
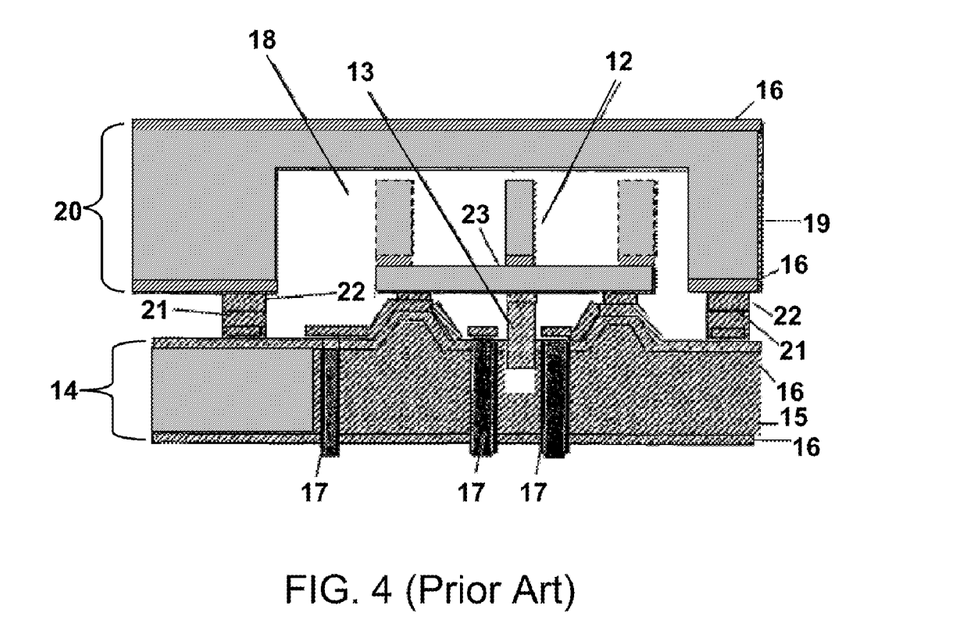
FIG. 4 is an example of using through-wafer interconnect for a MEMS device of the prior art.

An example of a MEMS micro-gyroscope using a through-wafer interconnect described in U.S. Pat. No. 7,015,060 to Kubena, which is incorporated herein by reference, is shown in FIG. 4. The gyroscope is formed using four wafers. A resonator 23 is formed from a top silicon layer of a silicon-on-insulator (SOI) wafer. A post 12 is formed from a bottom silicon layer of the SOI wafer. A second wafer bonded to the first wafer is used to form another post 13. A third wafer 14 having a silicon substrate 15 is etched to form pillars and through holes. The substrate 15 is oxidized to coat its front and back surfaces and line the walls of the through holes with a layer of $SiO_2$ 16. Electrically conductive interconnects 17 are formed by filling the through holes with metal. In this case, electroplated copper or copper alloy were preferred for the conducting material owing to the electrical requirements of the device. Metal is formed over the pillars and interconnects 17 and patterned to form electrodes connected to the interconnects. A hole is then made in the third wafer 14 to receive the post 13. The resonator 23 is then bonded to the third wafer 14 at the metal on the pillars. A cavity 18 is formed in a base layer 19 of a fourth wafer 20 (another SOI wafer) to accommodate the resonator 23 and post 12. The fourth wafer 20 is then bonded to the third wafer 14 using a sealing ring metal 21 and a solder 22. The fourth wafer 20 acts as a cap for the resonator 23. As seen in FIG. 4, the through-wafer interconnect is much more complicated than that in FIG. 2. This is because it is not straightforward to integrate the vertical interconnect concept directly to the various operating modes of MEMS devices.

Specifically, if a MEMS mirror device of the type shown in FIG. 1 were to be combined with a vertical through-wafer interconnect, the mirror, it would be desirable to precisely control the spacing between the layer from which the mirror is formed and the electrodes located underneath the mirror and on top of the through-wafer interconnects. Unfortunately, such precision is difficult to obtain with high yield using a process like that described in U.S. Pat. No. 7,015,060.

There are also challenges to utilizing through-wafer interconnects in a micromirror array application. These challenges include, e.g., the density of the interconnect, the locations of electrode, and the requirements for precision for the gap between the electrodes and the mirrors. The pitch of the micromirror array typically is between 50 μm to 500 μm. The pitch of the standard solder bump process is typically around 200 μm. If 4 electrodes are needed for each mirror, clearly some form of routing is required to distribute the electrodes from the patterns, required by the operation of the MEMS devices, to the contact patterns acceptable for the solder bump process.

It is within this context that embodiments of the present invention arise.

SUMMARY

The disadvantages of the prior art are overcome by embodiments of the present invention directed to a method for fabricating a microelectromechanical system (MEMS) device and a MEMS device.

According to a first embodiment, one or more conductive vias may be formed through a lower layer of a bottom substrate having an insulating layer sandwiched between an upper layer and the lower layer. Each of the vias is electrically isolated from the lower layer. The vias are electrically connected to one or more corresponding electrical contacts formed on a back side of the lower layer. One or more portions of the upper layer that overlie the one or more vias are selectively removed to form one or more device cavities. A device layer is bonded to the bottom substrate. One or more devices are formed from the device layer. Each of the devices overlies a corresponding one of the device cavities. Each of the devices is connected to the rest of the device layer by one or more corresponding hinges formed from the device layer. Each of the devices is electrically isolated from the vias.

In some versions of the first embodiment one or more device electrodes may be formed in the one or more device cavities, after forming the device cavities and before connecting the vias to the contacts. Each device electrode may be electrically connected to a corresponding one of the vias. In such versions, the device electrodes may be formed on one more portions of the insulating layer that have been exposed by removal of the one or more portions of the upper layer.

In some versions of the first embodiment, the bottom substrate may be a silicon on insulator substrate.

In some versions of the first embodiment, the device may be formed by removing selected portions of the device layer to form the devices and hinges.

In some versions of the first embodiment the one or more devices may include one or more mirrors.

In some versions of the first embodiment, forming the cavities may include protecting the back side of the lower layer during removal of the selected portions of the upper layer.

In some versions of the first embodiment, the device layer may be a layer of a top substrate having an insulator layer sandwiched between the device layer and an additional layer. In such versions, the additional layer may be removed before forming the devices.

In some versions of the first embodiment, the device layer and bottom substrate may be bonded by a high-temperature bonding process. In such versions an electrically conductive bonding material may be disposed on the electrical contacts formed on a back side of the lower layer after bonding the device layer to the bottom substrate.

In some versions of the first embodiment, the device layer and bottom substrate may be bonded by a low-temperature bonding process. In such versions an electrically conductive bonding material may be disposed on the electrical contacts formed on a back side of the lower layer before bonding the device layer to the bottom substrate.

According to a second embodiment, a microelectromechanical system (MEMS) device may comprise a bottom substrate and a device layer bonded to the bottom substrate. The bottom substrate has an insulating layer sandwiched between an upper layer and a lower layer. One or more conductive vias are formed through the lower layer at locations that underlie the one or more device cavities. Each via is electrically isolated from the lower layer. One or more portions of the upper layer have been selectively removed to form one or more device cavities. One or more devices are formed from the device layer. Each device overlies a corresponding device cavity. Each device is connected to the rest of the device layer by one or more corresponding hinges formed from the device layer. One or more electrical contacts are formed on a back side of the lower layer. Each contact is electrically connected to a corresponding conductive via.

In some versions of the second embodiment, the bottom substrate may be a silicon on insulator substrate.

In some versions of the second embodiment, selected portions of the mirror layer have been removed to form the devices and hinges.

In some versions of the second embodiment, the one or more devices include one or more mirrors.

In some versions of the second embodiment, one or more device electrodes may be formed in the one or more device cavities. Each device electrode may be electrically connected to a corresponding one of the one or more vias. In such versions, the device electrodes may be formed on one more portions of the insulating layer that are exposed by removal of the one or more portions of the upper layer to form the one or more cavities.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Introduction

In embodiments of the present invention through-wafer interconnects may be integrated with a bottom substrate that provides a precise spacer layer in a MEMS device. The spacer layer is sometimes herein referred to as a Spacer with Through Wafer Interconnects (STW)

MEMS Device Fabrication

By way of example, and not by way of limitation, FIG. 5 through FIG. 19 illustrates a possible sequence of operations for manufacturing a MEMS device according to an embodiment of the present invention. It is noted that in FIG. 5 though FIG. 19, the dimensions are not drawn to scale. In particular, the layer thicknesses and widths have been drawn to be visible to illustrate the relevant concepts. In the example illustrated in FIG. 5 through FIG. 19, a 1×N array is depicted for the sake of simplicity and clarity. Those of skill in the art will recognize that embodiments of the invention are not limited to 1×N configurations.

The manufacturing process may be broken down into three major parts: 1) fabrication of a bottom (STW) substrate; 2) fabrication of a device layer on another substrate (e.g., an SOI substrate); and 3) bonding the bottom substrate and device layer together and releasing the devices.

Figure 5:
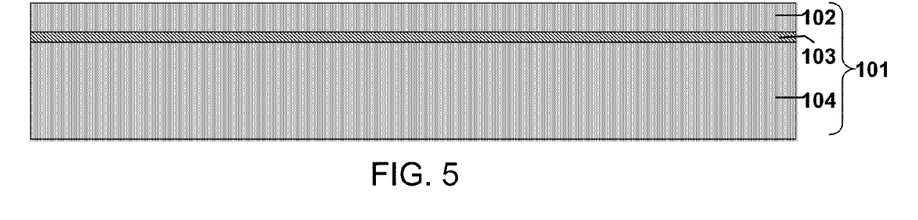
FIGS. 5 through 19 are a sequence of cross-sectional drawings detailing the process of manufacturing a MEMS device according to an embodiment of the present invention.

As shown in FIG. 5, the process of fabricating the STW starts with a bottom substrate 101 having an insulating layer 103 between a top layer 102 and a bottom layer 104. The top layer 102 and bottom layer 104 may be made of electrically conducting or semiconducting materials. By way of example, the bottom substrate may be a commercially available Semiconductor on insulator (SOI) wafer, e.g., having a silicon dioxide ($SiO_2$) layer sandwiched between upper and lower layers made of silicon. The thicknesses of the top layer 102 and the underlying insulating layer 103 can be precisely obtained, owing to the advanced wafer polishing processes used in the fabrication of SOI wafers. The thickness of the top layer can be from a few microns to hundreds of microns. By way of example, the thickness of the bottom layer 104 may be on the order of 500 µm to provide sufficient strength to avoid breaking the substrate during subsequent fabrication processes. However, when necessary, the substrate 101 may be made thinner to ease the through-wafer etching process.

In the embodiment illustrated, processing of the bottom layer is performed first. To avoid damage to the top layer 102 during the processing of the bottom layer 104, it is common to deposit some protection layer on the exposed surface of the top layer 102 (sometimes referred to herein as the front side). Examples of suitable materials for the top protection layer include, but are not limited to, polymers, silicon dioxide, silicon nitride and metals. However, for simplicity, this protection process is not illustrated here.

Figure 6:
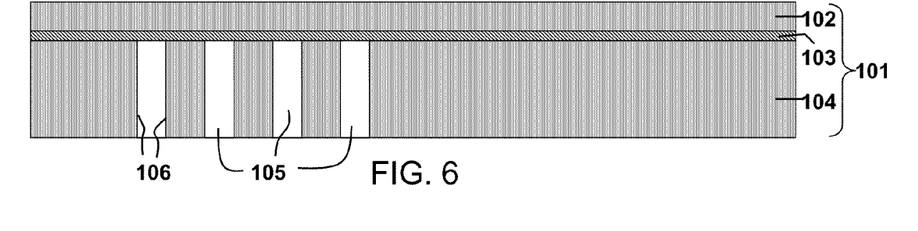

The exposed surface of the bottom layer 104 (sometimes referred to herein as the backside) may be patterned by standard photolithography to form an etching mask. The bottom layer 104 is then etched from the backside through one or more openings in the mask to form one or more through holes 105, as shown in FIG. 6. By way of example, an anisotropic etch, e.g., a Deep Reactive Ion Etch (DRIE), may be used to etch the through holes 105. The etch process may have sufficient etch selectivity that the insulating layer 103 acts as an etch stop.

For example, depending on the etch process used, the etch rate of $SiO_2$ and Si can be very different silicon and silicon dioxide (for example, an $SiO_2$:Si etch selectivity of 1:100). When an SOI wafer having $SiO_2$ between top and bottom silicon layers is etched using such an etch process the $SiO_2$ layer can serve as an etch stop. In FIG. 6, the etched holes are illustrated with straight side walls 106. However, in reality, the sidewalls may not be straight in the microscopic scale.

Figure 7:
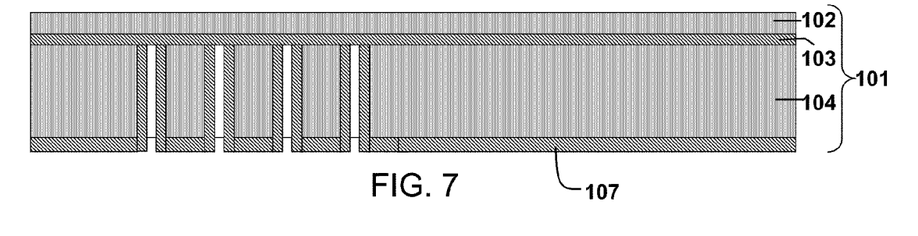

After a thorough clean, a layer of insulating material 107 (e.g., $SiO_2$) may be formed on the backside of the bottom layer 104 and the sidewalls 106 of the through holes 105, as shown in FIG. 7. By way of example, the insulating layer 107 may include a thermally grown oxide to ensure a good coverage. However, since the growth rate of thermal oxide is very slow, additional insulating material may be deposited on top of the thermal oxide to increase the breakdown voltage between the bottom substrate and electrodes that are subsequently deposited on the insulating layer 107.

Figure 8:
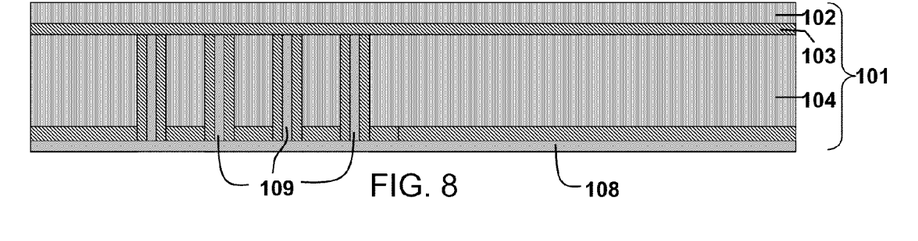
Figure 9:
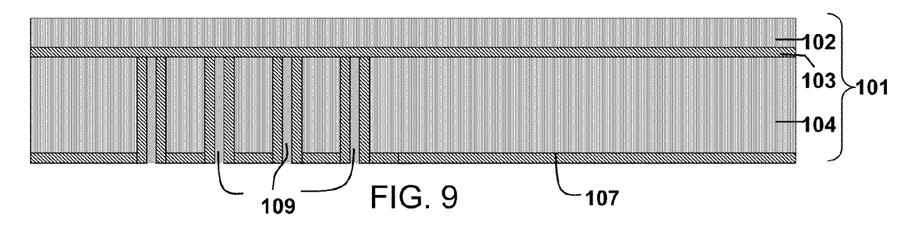

Conductive material 108 is then deposited or otherwise formed to coat the back side of the bottom substrate 104 and fill or coat the through holes, as shown in FIG. 8. Conductive material in the holes provides conductive vias 109 that are electrically insulated from the bottom substrate by the insulating material 107. The size of the through holes 105 is often a crucial parameter depending on the process used to form the conducting material 108. For example, if electroplating is used, sometimes voids may form due to necking of the opening of the holes. Poly-silicon is a good conductive material for achieving good coverage because it can be deposited by chemical vapor deposition (CVD). After the forming the conducting material 108, the backside may not be as smooth as depicted in FIG. 8. For further lithography process, a polish step may be implemented to planarize the back side and at the same time remove the conducting material outside the hole area as depicted in FIG. 9.

Figure 10:
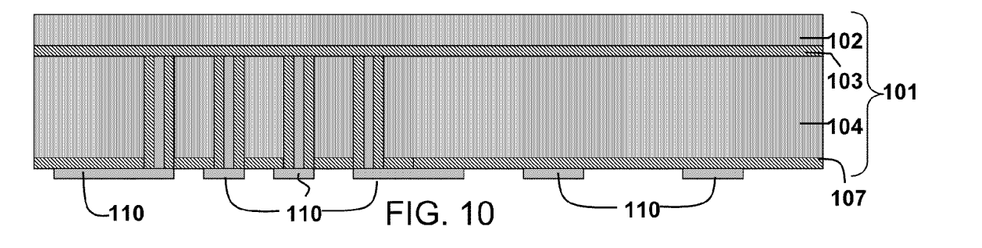
Figure 11:
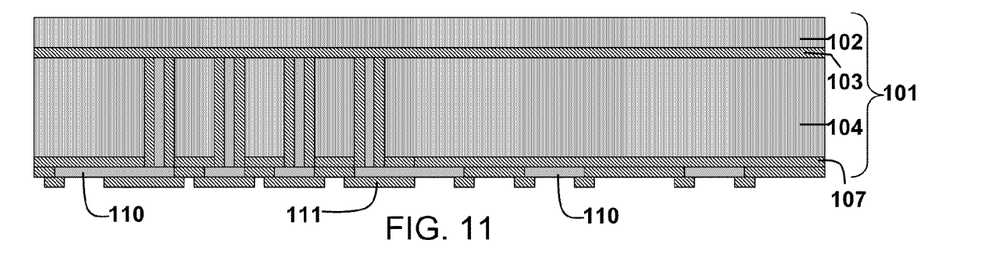
Figure 12:
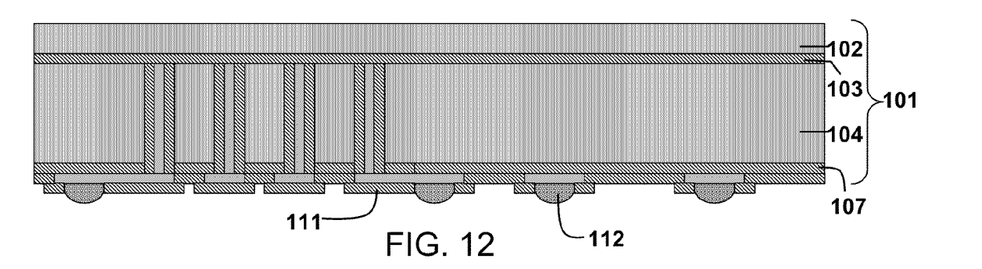

After the planarization, an interconnect metal may be deposited and patterned to form one or more electrodes 110 that are in electrical contact with the vias 109, as illustrated in FIG. 10. Another insulating layer 111 may be subsequently deposited on the backside of the bottom layer 104 and patterned as shown in FIG. 11. The insulating layer may be patterned so that bump pad areas of the electrodes 110 are exposed. Conductive bump material 112, e.g., a solder, may be selectively deposited on the bump areas that are exposed by openings in the second insulating layer 111, as shown in FIG. 12. Optionally, the bump material may be deposited at a later stage of manufacture if it is convenient. It is also possible to use a jet print process to apply a conducting epoxy in stead of solder bump. Furthermore, it is noted that the interconnect metal 110 and insulating layer 111 may also be formed and patterned at a later stage of fabrication, as discussed below.

Figure 13:
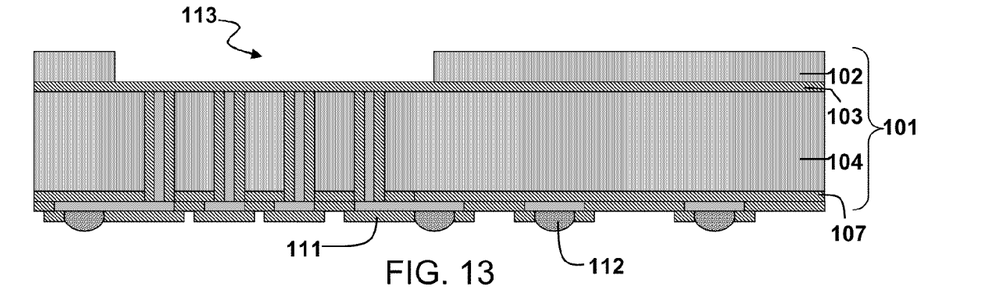

Once the vias 109 have been formed, processing of front side of the bottom substrate 101 may begin. After flipping over the bottom substrate 101 and removing the protection layer, a portion of the top layer 102 may be selectively removed, e.g., through a combination of photolithography and etching processes, leaving a gap 113 that exposes a portion of the insulating layer 103, as shown in FIG. 13. Because the thickness of the top layer 102 may be precisely controlled (e.g., less than 0.5 µm) during the fabrication of the bottom substrate 101, the etching of the top layer 102 produces a gap having a precise thickness (e.g., less than 0.5 µm).

The thickness precision of the top layer 102 can be within 0.05 um for layers less than 5 µm and within 0.3 µm for thicker layers. The precision of the thickness of the gap 113 may be the same for similar ranges of gap thickness. Preferably, the thickness precision of the gap 113 is better than 0.5 µm.

Figure 14:
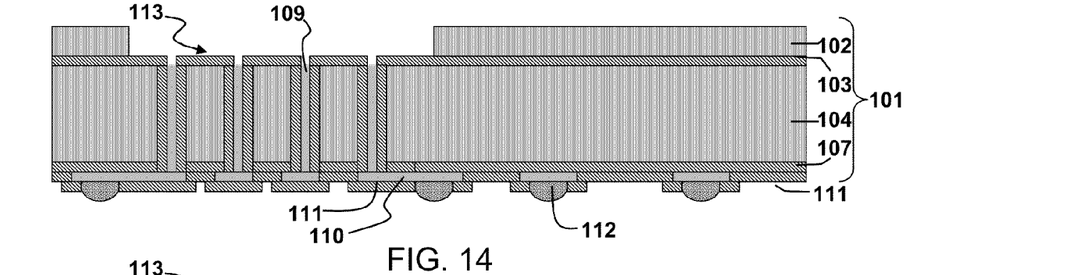
Figure 15:
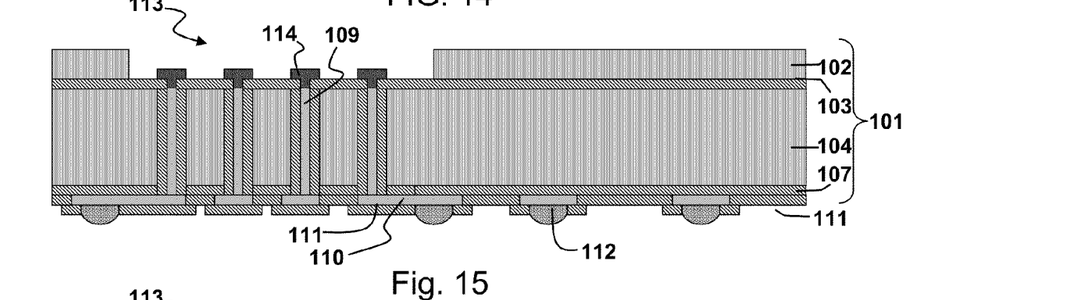

As shown in FIG. 14, selected portions of the insulating layer 103 of the bottom substrate 101 may be removed to expose the conductor in the holes that form the vias 109. Note that, because of the interconnect metal on the back side, the location of the through-holes may be conveniently located. One possibility is to use the conductive vias 109 (i.e., the conductive material in the through holes) as controlling electrodes for device operation. However, it may be desirable to use another conducting layer to form an electrode pattern. In such a case electrically conductive electrode material 114 may be deposited on exposed portions of the insulating layer 103 in electrical contact with the vias 109 and patterned to form electrodes as depicted in FIG. 15.

A device structure is fabricated on a separate substrate 115, referred to herein as a device substrate. One or more MEMS devices are fabricated from the device substrate. By way of example, and not by way of limitation, the MEMS devices may be MEMS mirrors. However, in alternative embodiments other MEMS devices may be fabricated. Examples of other MEMS devices include, but are not limited to, accelerometers, gyroscopes, pressure sensors, chemical sensors and switches.

There are many design options for the device structure and the device substrate. By way of example, and not by way of limitation, the device substrate 115 may be a composite wafer, e.g., a SOI wafer, having an insulator layer 117 sandwiched between a top layer 116 (referred to herein as a device layer) and a bottom layer 118. The thickness of the top layer 116 may be designed for optimal device performance.

The next step is to combine the bottom substrate 101 and the device substrate 115 together. There are multiple ways to perform this operation. One of the advantages of an approach based on SOI is that the entire substrate may be made mostly of silicon with a small proportion of dissimilar materials. This allows a very wide processing temperature window.

Figure 16:
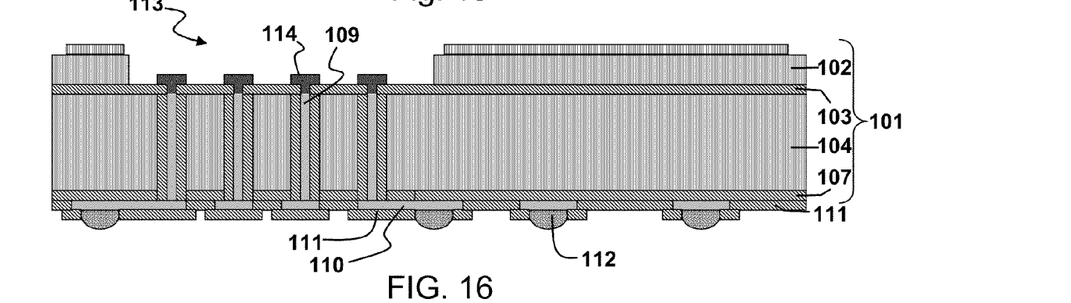

For example, if fusion bonding is chosen (in which a process temperature as high as >1000° C.), the filling conducting material 108 that forms the vias 109 may be polysilicon. The interconnect metal 110 and insulating layer 111 can be formed and patterned after the bonding process is completed. However, if a low temperature bonding process is chosen, such as eutectic bonding, a bonding material can be deposited after the back side processes are completed as shown in FIG. 16.

Figure 17:
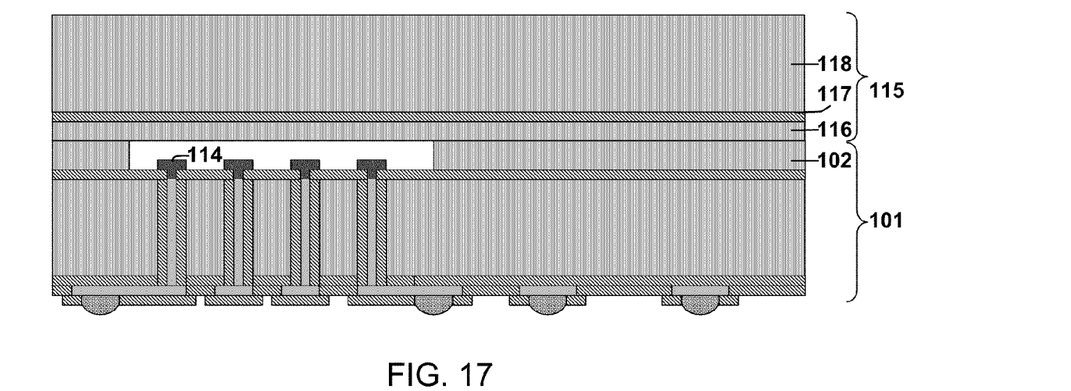
Figure 18:
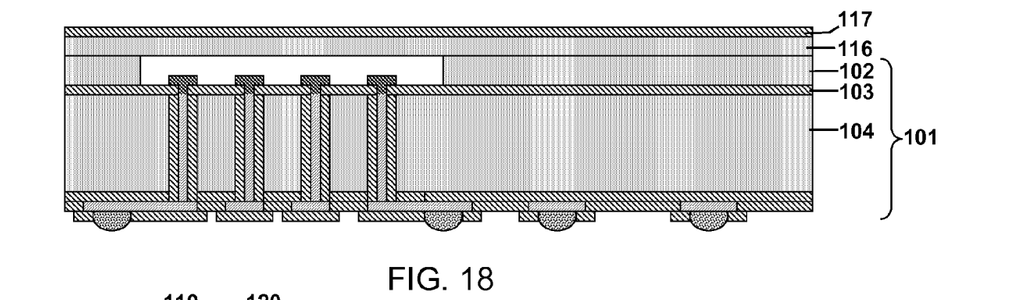

The bonding process may combine the bottom substrate 101 and device substrate 115 together with their respective top layers 102, 116 facing each other as shown in FIG. 17. The thick bottom layer 118 of the device substrate 115 provides structural support for the device layer 116 and insulating layer 117 during the bonding process. After bonding, a standard process may be used to remove the bottom layer 118 of the device substrate 115 as depicted in FIG. 18. The exposed surface of the insulating layer 117 (or, if part of the insulating layer is removed, an exposed underside of the device layer 116) may then be patterned to define a device 119 to be formed from the device layer 116 of the device substrate 115. The device is formed over a cavity formed by the gap 113 between the insulator layer 103 of the bottom substrate 101 and the device layer 116 of the device substrate 115. The thickness of the cavity may be made to a desired precision as long as the thickness of the top layer 102 was sufficiently precisely controlled during initial fabrication of the bottom substrate 101.

Figure 19:
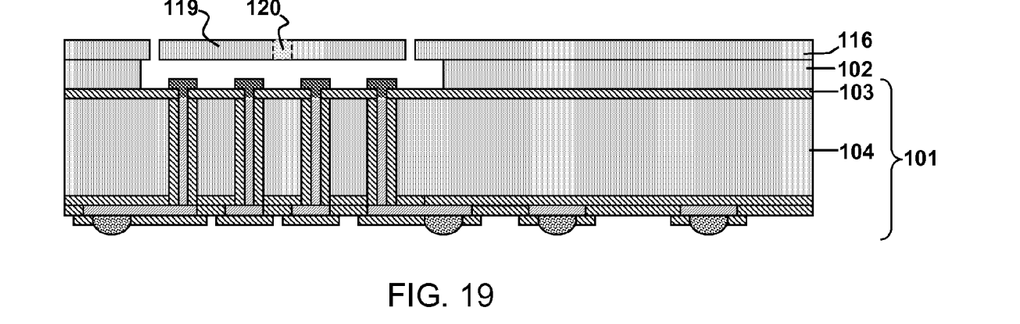

The device 119 may be released from the top layer 116 by another etching process that removes selected portions of the device layer 116 as illustrated in FIG. 19. The device 119 may be connected to other portions of the device layer 116 by one or more thin portions 120 that can act as torsional hinges. The device 119 is electrically isolated from the electrodes 114 and vias 109 by the insulating layer 103 and insulating material 107. When a voltage is applied to one of the electrodes 114 the device may rotate about the hinges 120 toward the electrode 114. The precise thickness of the top layer 102 of the bottom substrate 101 provides a precise gap between the device 119 and the electrodes 114.

Embodiments of the present invention provide a novel approach to realize a MEMS device structure with improved yield (number of dies per wafer) and a much larger process flexibility. Although fabrication of a single is shown for the sake of clarity, those of skill in the art will realize that the process described above may be extended to simultaneous fabrication of an arbitrary number of devices on a common substrate.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for fabricating a microelectromechanical system (MEMS) device, comprising:
   a) forming one or more conductive vias through a lower layer of a bottom substrate having an insulating layer sandwiched between an upper layer and the lower layer, wherein each of the vias is electrically isolated from the lower layer;
   b) electrically connecting the vias to one or more corresponding electrical contacts formed on a back side of the lower layer;
   c) selectively removing one or more portions of the upper layer that overlie the one or more vias to form one or more device cavities;
   d) bonding a device layer to the bottom substrate; and
   e) forming one or more devices from the device layer, wherein each of the one or more devices overlies a corresponding one of the one or more device cavities, and wherein each of the one or more devices is connected to the rest of the device layer by one or more corresponding hinges, wherein each hinge is formed from the device layer, and wherein each of the one or more devices is electrically isolated from the one or more vias.

2. The method of claim 1 wherein the bottom substrate is a silicon on insulator substrate.

3. The method of claim 1 wherein e) includes removing selected portions of the device layer to form the one or more devices and one or more hinges.

4. The method of claim 1 wherein the one or more devices include one or more mirrors.

5. The method of claim 1 wherein c) includes protecting the back side of the lower layer during removal of the selected portions of the upper layer.

6. The method of claim 1 wherein d) includes a high-temperature bonding process.

7. The method of claim 1 wherein d) includes a low-temperature bonding process.

8. The method of claim 1, further comprising, after c) and before b), forming one or more device electrodes in the one or more device cavities, wherein each device electrode is electrically connected to a corresponding one of the one or more vias.

9. The method of claim 8 wherein the one or more device electrodes are formed on one more portions of the insulating layer exposed by removal of the one or more portions of the upper layer.

10. The method of claim 1 wherein the device layer is a layer of a top substrate having an insulator layer sandwiched between the device layer and an additional layer.

11. The method of claim 10, further comprising removing the additional layer prior to e).

12. The method of claim 11, further comprising: after d) disposing an electrically conductive bonding material on the electrical contacts formed on a back side of the lower layer.

13. The method of claim 12, further comprising: before d) disposing an electrically conductive bonding material on the electrical contacts formed on a back side of the lower layer.

14. A microelectromechanical system (MEMS) device, comprising:
   a) a bottom substrate having an insulating layer sandwiched between an upper layer and a lower layer, wherein one or more portions of the upper layer have been selectively removed to form one or more device cavities;
   b) one or more conductive vias formed through the lower layer at locations that underlie the one or more device cavities, wherein each of the vias is electrically isolated from the lower layer;
   c) one or more electrical contacts formed on a back side of the lower layer, wherein each of the one or more electrical contacts is electrically connected to a corresponding one of the one or more conductive vias;
   d) a device layer bonded to the bottom substrate; and
   e) one or more devices formed from the device layer, wherein each of the one or more devices overlies a corresponding one of the one or more device cavities, and wherein each of the one or more devices is connected to the rest of the device layer by one or more corresponding hinges, wherein each hinge is formed from the device layer.

15. The device of claim 14 wherein the bottom substrate is a silicon on insulator substrate.

16. The device of claim 14 wherein selected portions of the device layer have been removed to form the one or more devices and one or more hinges.

17. The device of claim 14 wherein the one or more devices include one or more mirrors.

18. The device of claim 14, further comprising one or more device electrodes formed in the one or more device cavities, wherein each device electrode is electrically connected to a corresponding one of the one or more vias.

19. The device of claim 18 wherein the one or more device electrodes are formed on one more portions of the insulating layer that are exposed by removal of the one or more portions of the upper layer.

* * * * *